(12) United States Patent
Hirano et al.

(10) Patent No.: US 8,698,264 B2
(45) Date of Patent: Apr. 15, 2014

(54) PHOTOELECTRIC CONVERSION MODULE

(75) Inventors: Kouki Hirano, Hitachinaka (JP); Hiroki Yasuda, Mito (JP); Yoshinori Sunaga, Hitachinaka (JP); Shohei Hata, Yokohama (JP)

(73) Assignee: Hitachi Cable, Ltd., Tokyo (JP)

( * ) Notice: Subject to any disclaimer, the term of this patent is extended or adjusted under 35 U.S.C. 154(b) by 113 days.

(21) Appl. No.: 13/355,668

(22) Filed: Jan. 23, 2012

(65) Prior Publication Data
US 2012/0193742 A1   Aug. 2, 2012

(30) Foreign Application Priority Data
Jan. 31, 2011   (JP) .................................. 2011-018140

(51) Int. Cl.
*H01L 31/0203*   (2006.01)

(52) U.S. Cl.
USPC .... 257/433; 257/431; 257/432; 257/E31.001; 257/E31.117

(58) Field of Classification Search
USPC ........... 257/431, 432, 433, E31.001, E31.117
See application file for complete search history.

(56) References Cited

U.S. PATENT DOCUMENTS

| | | |
|---|---|---|
| 4,897,711 A | 1/1990 | Blonder et al. |
| 2007/0125420 A1* | 6/2007 | Ezure et al. ................... 136/263 |
| 2008/0226221 A1 | 9/2008 | Bidnyk et al. |
| 2008/0317995 A1 | 12/2008 | Oldsen et al. |
| 2009/0016732 A1 | 1/2009 | Ueno et al. |
| 2010/0142886 A1 | 6/2010 | Warashina et al. |
| 2012/0006406 A1* | 1/2012 | Usui et al. ..................... 136/259 |
| 2012/0037787 A1* | 2/2012 | Kitada et al. ................ 250/208.1 |
| 2012/0195545 A1* | 8/2012 | Yasuda et al. ................... 385/14 |

FOREIGN PATENT DOCUMENTS

| | | |
|---|---|---|
| JP | 02-9183 A | 1/1990 |
| JP | 6-151903 A | 5/1994 |
| JP | 11-97797 A | 4/1999 |
| JP | 2007-324303 A | 12/2007 |
| JP | 2009-21459 A | 1/2009 |
| JP | 2009-516365 A | 4/2009 |
| JP | 2010-135630 A | 6/2010 |

OTHER PUBLICATIONS

Japanese Office Action dated Jan. 9, 2014 (and English translation thereof) in counterpart Japanese Application No. 2011-018140.

* cited by examiner

*Primary Examiner* — Andy Huynh
(74) *Attorney, Agent, or Firm* — Holtz, Holtz, Goodman & Chick, PC

(57) ABSTRACT

A photoelectric conversion module includes: a substrate having a light transmitting property and having a mounting surface; a photoelectric conversion element mounted on the mounting surface of the substrate; a cover member fixed to the substrate via a solder layer constituted by solder and forming, cooperatively with the substrate, an airtight chamber housing the photoelectric conversion element; and a solder adsorbing film provided near an area fixed to the substrate by the solder layer, in a surface, of the cover member, facing the mounting surface, the solder having an adhesive property to the solder adsorbing film.

19 Claims, 19 Drawing Sheets

PHOTOELECTRIC CONVERSION MODULE

BACKGROUND OF THE INVENTION

1. Field of the Invention

The present invention relates to a photoelectric conversion module and a method of manufacturing a photoelectric conversion module.

2. Description of the Related Art

As transmission mediums, for example, in the connection between a server and a switch in a data center and in the connection between digital AV (audio visual) devices, optical fibers are also used in addition to metal wires. Further, in recent years, the use of optical fibers as transmission mediums, that is, optical interconnection, also in information processing devices such as mobile phones and personal computers has been considered. Refer to Japanese Patent Application Laid-open No. 2009-21459, for instance.

When the optical fibers are used, a photoelectric conversion module converting an electrical signal to an optical signal or converting an optical signal to an electrical signal is required. For example, a photoelectric conversion module disclosed in Japanese Patent Application Laid-open No. 2007-324303 includes an inorganic material substrate, and a photoelectric conversion element is mounted on the inorganic material substrate. A package is airtightly joined to the inorganic material substrate with solder balls.

As the photoelectric conversion module is more downsized, a length and an interval of traces of a conductor pattern provided on the substrate become shorter and a distance between the solder balls and the traces also becomes shorter. Accordingly, when the solder balls for sealing deform to spread at the time of the joining between the substrate and the package, solder adheres to unwanted traces, which involves a risk of short circuit.

SUMMARY OF THE INVENTION

It is an object of the present invention to provide a highly reliable photoelectric conversion module in which short circuit due to the spread of sealing solder is prevented even when it is downsized.

It is another object of the present invention to provide a method of manufacturing the photoelectric conversion module.

According to one aspect of the present invention, there is provided a photoelectric conversion module including: a substrate having a light transmitting property and having a mounting surface; a photoelectric conversion element mounted on the mounting surface of the substrate; a cover member fixed to the substrate via a solder layer constituted by solder and forming, cooperatively with the substrate, an airtight chamber housing the photoelectric conversion element; and a solder adsorbing film provided near an area fixed to the substrate by the solder layer, in a surface, of the cover member, facing the mounting surface, the solder having an adhesive property to the solder adsorbing film.

According to another aspect of the present invention, there is provided a method of manufacturing a photoelectric conversion module, the method including: a preparation step of preparing a first wafer to be divided into substrates each having a light transmitting property and having a mounting surface and a second wafer to be divided into cover members each fixed to the substrate via a solder layer constituted by solder and forming, cooperatively with the substrate, an airtight chamber housing a photoelectric conversion element; a mounting step of mounting, on the first wafer, the photoelectric conversion elements corresponding to the respective substrates; a film forming step of forming solder adsorbing films to which the solder has an adhesive property, near areas, in the second wafer, to be fixed to the substrates by the solder layers; a joining step of fixing the second wafer to the first wafer via the solder layer; and a dividing step of dividing the first wafer and the second wafer into the substrates and the cover members after the joining step.

Further scope of applicability of the present invention will become apparent from the detailed description given hereinafter. The detailed description and embodiments are only given as examples though showing preferred embodiments of the present invention, and therefore, from the contents of the following detailed description, changes and modifications of various kinds within the spirits and scope of the invention will become apparent to those skilled in the art.

BRIEF DESCRIPTION OF THE DRAWINGS

The present invention will be fully understood from the following detailed description and the accompanying drawings. The accompanying drawings only show examples and are not intended to restrict the present invention. In the accompanying drawings.

DETAILED DESCRIPTION

First Embodiment

Hereinafter, an embodiment of the present invention will be described with reference to the drawings.

Figure 1:
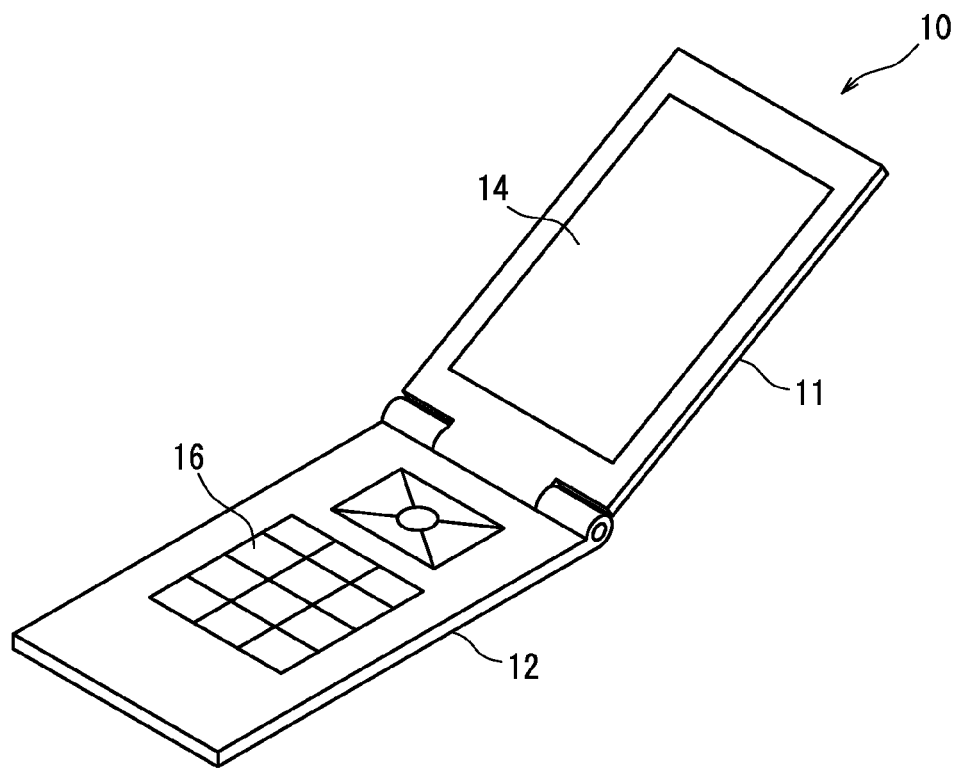
FIG. 1 is a perspective view showing a schematic structure of a mobile phone including an optical wiring using photoelectric conversion modules of a first embodiment.

FIG. 1 is a perspective view schematically showing an outer appearance of a mobile phone 10. The mobile phone 10 is of, for example, a fold type, in which a first case 11 and a second case 12 are coupled via a hinge. A liquid crystal panel 14 is placed on the first case 11, and buttons 16 are placed on the second case 12, and a user is capable of obtaining information from an image displayed on the liquid crystal panel 14.

Figure 2:
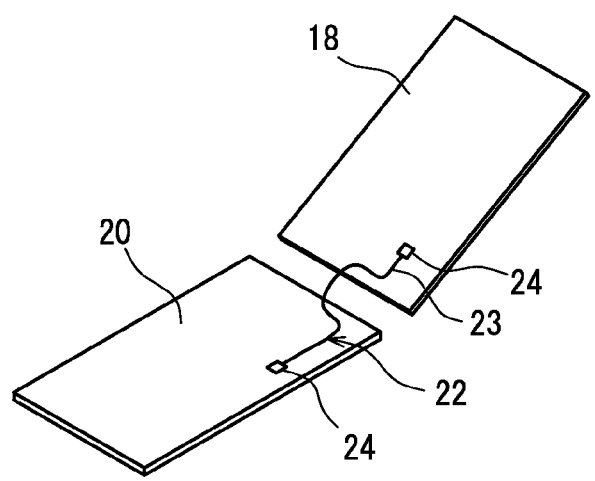
FIG. 2 is a schematic perspective view showing a first motherboard and a second motherboard used in the mobile phone in FIG. 1 as well as the optical wiring.

FIG. 2 shows a first motherboard 18 and a second motherboard 20 disposed in the first case 11 and the second case 12 respectively. Though not shown, electric components forming a driving circuit of the liquid crystal panel 14 are mounted on the first motherboard 18, and electric components forming an input circuit connected to the buttons 16, a communication circuit, and an image processing circuit are mounted on the second motherboard 20.

The driving circuit on the first motherboard 18 and the image processing circuit on the second motherboard 20 are connected by an optical wiring 22. That is, the driving circuit receives image data from the image processing circuit through the optical wiring 22 and makes the liquid crystal display panel 14 display an image based on the received image data.

[Photoelectric Conversion Module]

The optical wiring 22 is constituted by an optical fiber 23 and photoelectric conversion modules 24, 24 of a first embodiment integrally provided at both ends of the optical fiber 23.

Figure 3:
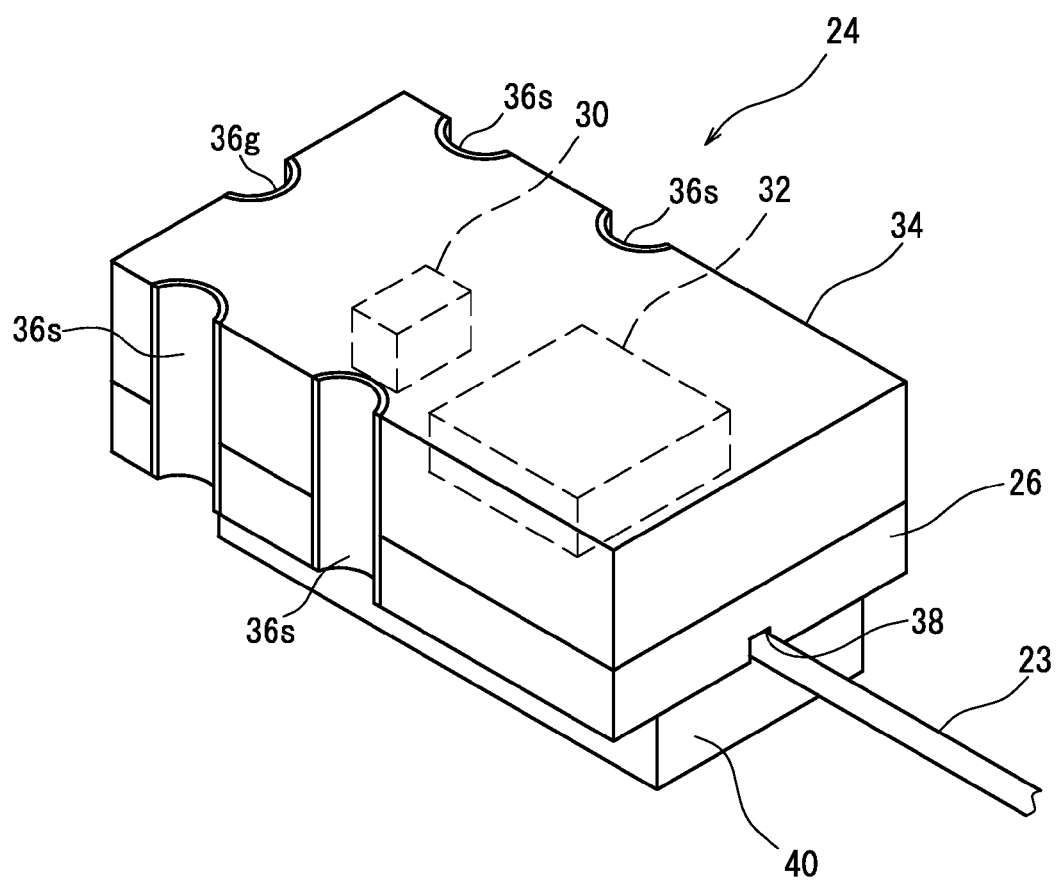
FIG. 3 is a perspective view schematically showing an outer appearance of the photoelectric conversion module of the first embodiment.

FIG. 3 is a perspective view schematically showing an outer appearance of the photoelectric conversion module 24. The photoelectric conversion module 24 includes a substrate 26 having a light transmitting property, and the substrate 26 is made of, for example, resin, an inorganic material, or a composite material of resin and an inorganic material. As the inorganic material, one kind selected from a group consisting of glass, silicon, and sapphire is usable.

For example, in the case of 1 ch (channel), the substrate 26 has a thickness within a range of not less than 100 μm nor more than 500 μm, a vertical length within a range of not less than 700 μm nor more than 5000 μm, and a lateral length within a range of not less than 700 μm nor more than 5000 μm.

On one surface (mounting surface) of the substrate 26, a photoelectric conversion element 30 and an IC (integrated circuit) chip 32 are mounted by, for example, flip-chip.

In more detail, in the photoelectric conversion module 24 connected to the second motherboard 20, the photoelectric conversion element 30 is a light-emitting element such as LD (laser diode), and the IC chip 32 forms a driving circuit for driving the photoelectric conversion element 30.

Further, in the photoelectric conversion module 24 connected to the first motherboard 18, the photoelectric conversion element 30 is a light-receiving element such as PD (photodiode) and the IC chip 32 forms an amplifier circuit for amplifying an electric signal output by the light-receiving element.

The photoelectric conversion element 30 is of a surface emitting type or of a surface receiving type, and its emission part or incident part is disposed to face the mounting surface.

Further, a cover member 34 is airtightly fixed to the mounting surface of the substrate 26 so as to cover the photoelectric conversion element 30 and the IC chip 32. The cover member 34 is made of, for example, resin, an inorganic material, or a composite material of resin and an inorganic material. As the inorganic material, one kind selected from a group consisting of glass, silicon, and sapphire is usable, for instance.

Preferably, a coefficient of linear expansion of the cover member 34 is equal to a coefficient of linear expansion of the substrate 26, and for this purpose, the cover member 34 and the substrate 26 are made of the same material.

For example, a thickness of the cover member 34 falls within a range of not less than 400 μm nor more than 1000 μm, and an area of a surface, of the cover member 34, facing the mounting surface of the substrate 26 is substantially equal to that of the mounting surface of the substrate 26.

In this embodiment, as a preferable form, a plurality of a series of concave portions extending from end to end of the substrate 26 and the cover member 34 in their thickness direction are formed in side surfaces of the substrate 26 and the cover member 34, and on the whole areas of surfaces of the concave portions, filmy conductive members (side electrodes) having conductivity are formed. The conductive members include a ground electrode 36g and electrodes for signal or for power supply (signal/power supply electrodes) 36s.

Note that the ground electrode 36g and the signal/power supply electrodes 36s are sometimes collectively called conductive members 36 below.

The conductive members 36 are each made of, for example, a film of a single metal selected from a group consisting of Au, Cu, and Ni or an alloy thereof, or made of a laminate of these films. Preferably, the conductive members 36 are each a laminate in which a Cu plating film, a Ni plating film, and an Au plating film are stacked in the order mentioned and the Au plating film is located on an uppermost layer.

On a surface (rear surface), of the substrate 26, opposite the mounting surface, a holding groove 38 is provided, and a tip portion of the optical fiber 23 is disposed in the holding groove 38. On the rear surface of the substrate 26, a plate-shaped reinforcing member 40 is fixed so as to cover the holding groove 38. The reinforcing member 40 is made of, for example, glass. A thickness of the reinforcing member 40 is, for example, within a range of not less than 100 μm nor more than 1000 μm.

Figure 4:
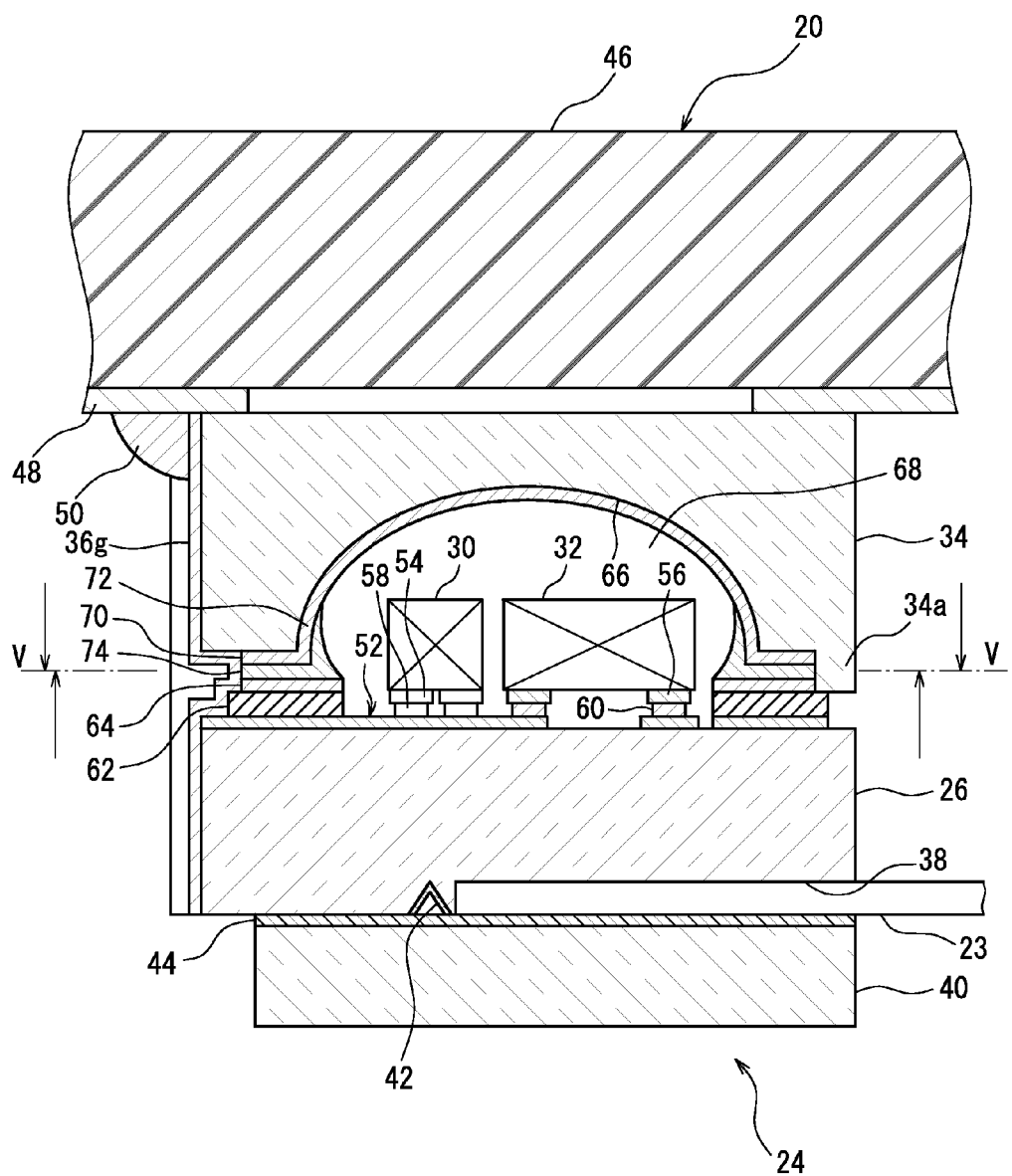
FIG. 4 is a schematic cross-sectional view of the photoelectric conversion module attached to the second motherboard.

FIG. 4 is a schematic cross-sectional view of the photoelectric conversion module 24 mounted on the second motherboard 20.

The holding groove 38 extends along the substrate 26 in an arrangement direction of the photoelectric conversion element 30 and the IC chip 32 (hereinafter, simply referred to as an arrangement direction D). The holding groove 38 has a quadrangular sectional shape, that is, it is an angular U-shaped U-groove.

In this embodiment, as a preferable form, in terms of the arrangement direction D, one end, of the holding groove 38, located on the IC chip 32 side is opened in a side surface of the substrate 26 and the other end of the holding groove 38 is formed by a wall surface. Further, the tip portion of the optical fiber 23 is fixed in the holding groove 38 by an adhesive, and a tip surface of the optical fiber 23 abuts on the wall surface of the holding groove 38 at the other end.

Further, a V-groove is formed in the rear surface of the substrate 26, and on a wall surface of the V-groove, a vapor deposition film made of metal such as, for example, Au is formed. The vapor deposition film forms a mirror 42, and the mirror 42 forms an optical element optically coupling the photoelectric conversion element 30 and the tip surface of the optical fiber 23 via the substrate 26.

Note that the holding groove 38 and the V-groove can be formed by members different from the substrate 26. A possible example may to form a resin layer by applying a resin material on the rear surface of the substrate 26 and form the holding groove and the V-groove in this resin layer.

The reinforcing member 40 is fixed on the rear surface of the substrate 26 by an adhesive layer 44 made of an adhesive. The reinforcing member 40 covers the holding groove 38, and together with the substrate 26, it firmly holds the tip portion of the optical fiber 23. An area of a surface, of the reinforcing member 40, bonded to the substrate 26 is smaller than an area of the rear surface of the substrate 26. The reinforcing member 40 is fixed to the rear surface of the substrate 26 so that part of the vicinity of an outer edge of the rear surface of the substrate 26 is exposed.

The second motherboard 20 is composed of a rigid board main body 46 made of, for example, glass epoxy resin and a conductor pattern 48 made of a conductor such as copper. The conductor pattern 48 of the second motherboard 20 is connected to the conductive members 36 of the photoelectric conversion module 24 by connection parts 50 made of, for example, solder.

On the mounting surface of the substrate 26, a conductor pattern 52 for electrically connecting the photoelectric conversion element 30 and the IC chip 32 and for electrically connecting the IC chip 32 and the conductive members 36 is provided. To form the conductor pattern 52, a conductive thin film made of, for example, copper or the like is etched.

The photoelectric conversion element 30 and the IC chip 32 have, as input/output terminals, a plurality of electrode pads 54 and a plurality of electrode pads 56 respectively, and the electrode pads 54, 56 are connected to the conductor pattern 52 of the substrate 26 via bumps 58, 60 made of, for example, Au. The conductor pattern 52 extends up to the concave portions of the side surfaces of the substrate 26 and is connected to the conductive members 36.

Further, on the mounting surface of the substrate 26, an insulating layer 62 is provided along its outer edge. The insulating layer 62 has a frame shape and surrounds the photoelectric conversion element 30 and the IC chip 32. The insulating layer 62 covers portions, of the conductor pattern 52, intersecting with itself. For example, the insulating layer 62 has a thickness within a range of not less than 0.5 μm nor more than 50 μm and a width within a range of nor less than 10 μm nor more than 400 μm.

The insulating layer 62 is made of a nonconductive substance, and is made of, for example, an inorganic oxide such as silicon oxide or aluminum oxide. The insulating layer 62 is formed by physical vapor deposition or chemical vapor deposition.

On the insulating layer 62, a substrate-side base film 64 is formed. The substrate-side base film 64 has a frame shape and has affinity or wettability to solder. In other words, solder has an adhesive property to the substrate-side base film 64. The substrate-side base film 64 is made of, for example, a film of a single metal selected from a group consisting of Au, Cu, and Cr or an alloy thereof, or made of a laminate of these films.

The cover member 34 has a depression 66 at a center of its surface (facing surface) facing the mounting surface of the substrate 26. Preferably, in a wall surface of the depression 66, an area near an opening edge is inclined relative to the mounting surface. Concretely, the wall surface of the depression 66 is a curved surface and has a bowl shape or a mortar shape.

The wall surface of the depression 66 together with the mounting surface defines a chamber (housing chamber) 68 for housing the photoelectric conversion element 30 and the IC chip 32. The depression 66 is formed by, for example, sandblasting.

The depression 66 is opened in the facing surface of the cover member 34, and the facing surface has a frame-shaped junction area around the opening of the depression 66. On the junction area of the cover member 34, a cover-side base film 70 is formed. The cover-side base film 70 has a frame shape and has affinity or wettability to solder. The cover-side base film 70 is made of, for example, a film of a single metal selected from a group consisting of Au, Cu, and Cr or an alloy thereof, or made of a laminate of these films.

Further, on the wall surface of the depression 66, a solder adsorbing film 72 integrally continuing from an inner edge of the cover-side base film 70 is formed. Preferably, the solder adsorbing film 72 is formed on the whole area of the wall surface of the depression 66. The solder adsorbing film 72 has affinity or wettability to solder and preferably has conductivity. The solder adsorbing film 72 is made of, for example, a film of a single metal selected from a group consisting of Au, Cu, and Cr or an alloy thereof, or made of a laminate of these films. The solder adsorbing film 72 can be formed by physical vapor deposition or chemical vapor deposition, for example, at the same time when the cover-side base film 70 is formed.

The substrate-side base film 64 is disposed to face the cover-side base film 70. Preferably, the substrate-side base film 64 extends toward a more inner side of the housing chamber 68 than the cover-side base film 70. The substrate-side base film 64 and the cover-side base film 70 are airtightly connected to each other via a solder layer 74 constituted by solder. The solder is, for example, an Au—Sn alloy or an Sn—Ag alloy.

Therefore, the housing chamber 68 is an airtight chamber, and the to housing chamber 68 is filled with dry gas, preferably inert gas. The inert gas is, for example, rare gas such as He or nitrogen gas. Alternatively, the housing chamber 68 may be vacuum or pressure-reduced.

Figure 5:
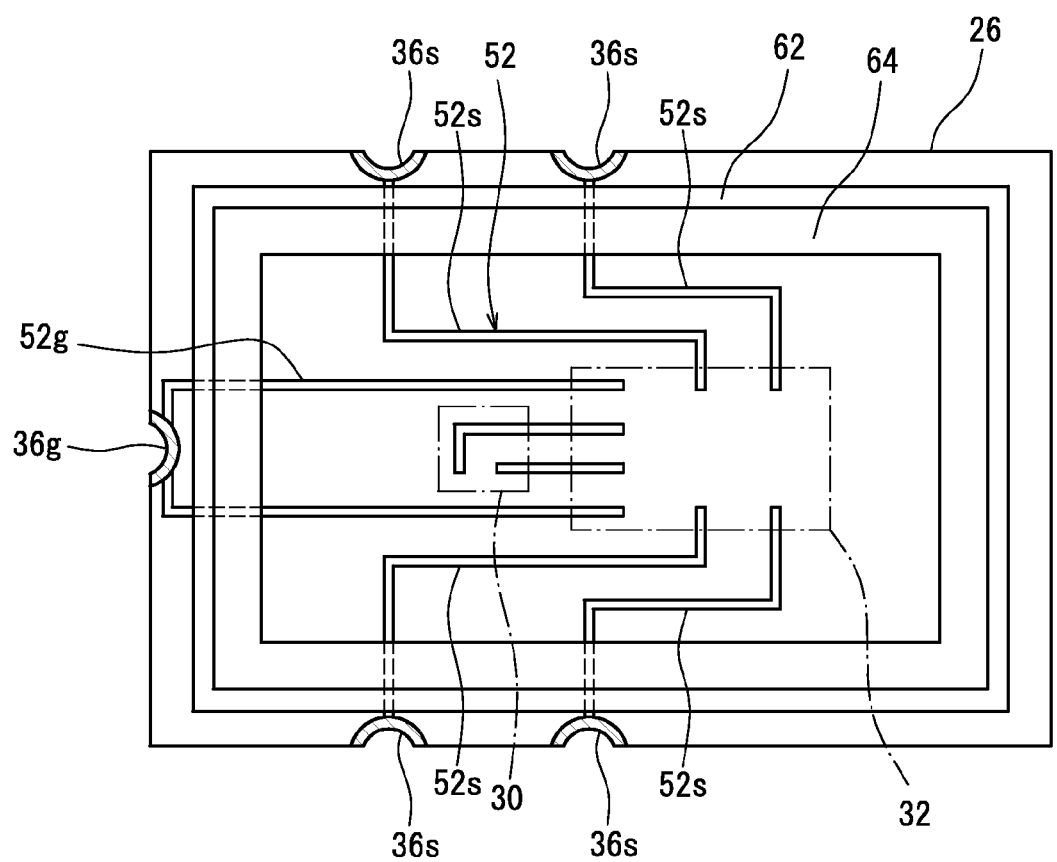
FIG. 5 is a plane view schematically showing a mounting surface of a substrate of the photoelectric conversion module taken along the V-V line in FIG. 4, with a solder layer, a photoelectric conversion element, and an IC chip being removed.

FIG. 5 is a plane view schematically showing the mounting surface of the substrate 26 of the photoelectric conversion module 24 taken along the V-V line in FIG. 4, with the solder layer 74, the photoelectric conversion element 30, and the IC chip 32 being removed. As shown in FIG. 5, an outer edge of the substrate-side base film 64 is located on a more inner side than an outer edge of the insulating layer 62.

The conductor pattern 52 provided on the mounting surface includes a ground line 52g connected to the ground electrode 36g and signal/power supply lines 52s connected to the signal/power supply electrodes 36s. The ground line 52g and the signal/power supply lines 52s all extend to cross the insulating layer 62.

Figure 6:
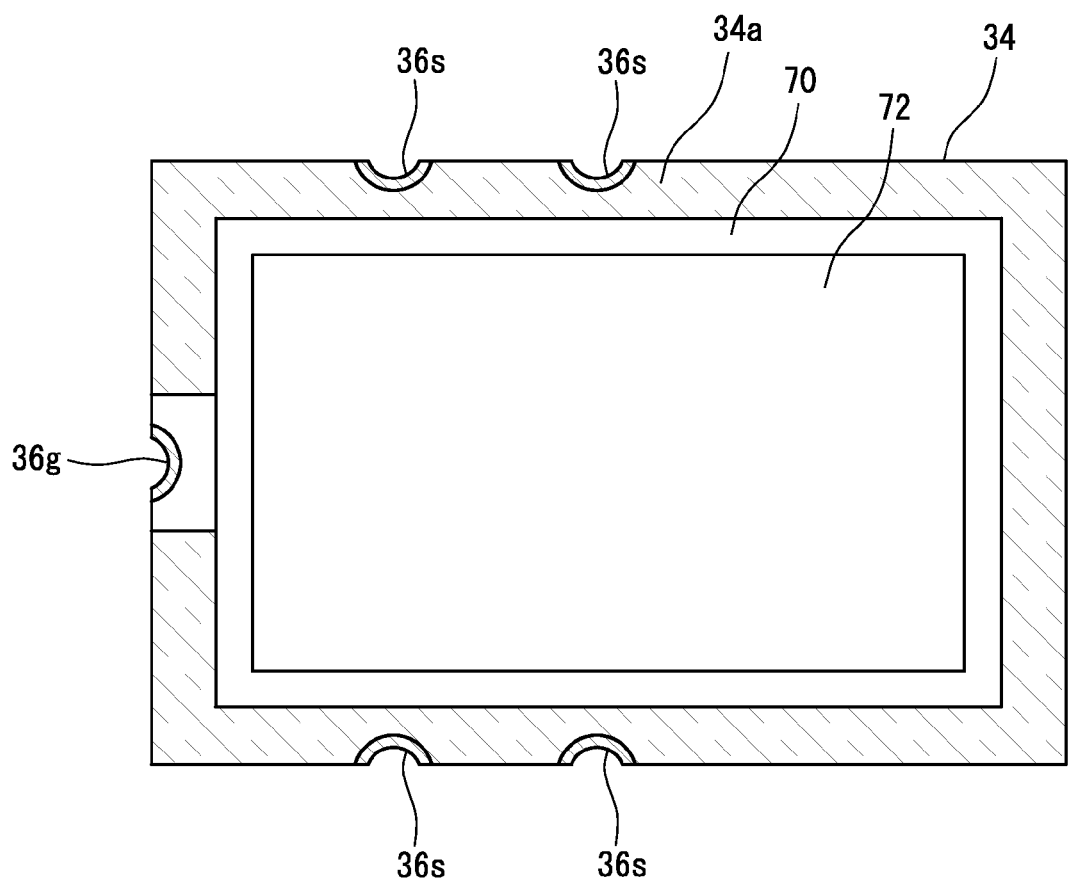
FIG. 6 is a plane view schematically showing a facing surface, of a cover member, facing the mounting surface of the substrate of the photoelectric conversion module taken along the V-V line in FIG. 4, with the solder layer being removed.

FIG. 6 is a plane view schematically showing the facing surface, of the cover member 34, facing the mounting surface of the substrate 26 of the photoelectric conversion module 24 taken along the V-V line in FIG. 4, with the solder layer 74 being removed.

The cover-side base film 70 is provided on an area facing the substrate-side base film 64 and is located on a more inner side than the outer edge of the insulating layer 62. The cover member 34 has a frame-shaped projection 34a that protrudes toward the substrate 26 from the outer edge of the facing surface so as to surround the cover-side base film 70. Accordingly, in the cover member 34, the cover-side base film 70 is provided in a flat frame-shaped area present between the projection 34a and the depression 66.

In this embodiment, as a preferable form, the solder adsorbing film 72 is formed on the whole area of the wall surface of the depression 66 and is also grounded. Therefore, the projection 34a is not provided near the ground electrode 36g.

Figure 7:
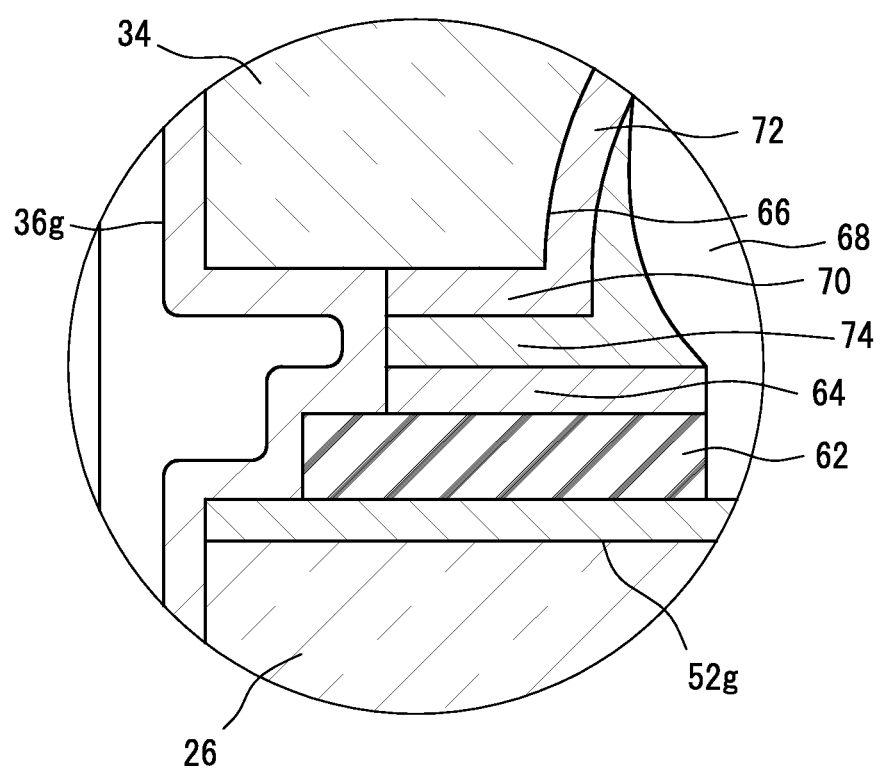
FIG. 7 is an enlarged cross-sectional view schematically showing a junction area between the substrate and the cover member, used to explain a connection structure between a solder adsorbing film and a ground electrode in the photoelectric conversion module in FIG. 3.

FIG. 7 is an enlarged cross-sectional view schematically showing the junction area between the substrate 26 and the cover member 34, used to explain a connection structure between the ground electrode 36g and the cover-side base film 70. As shown in FIG. 7, the ground electrode 36g is connected to ends of the cover-side base film 70, the solder layer 74, and the substrate-side base film 64.

Figure 8:
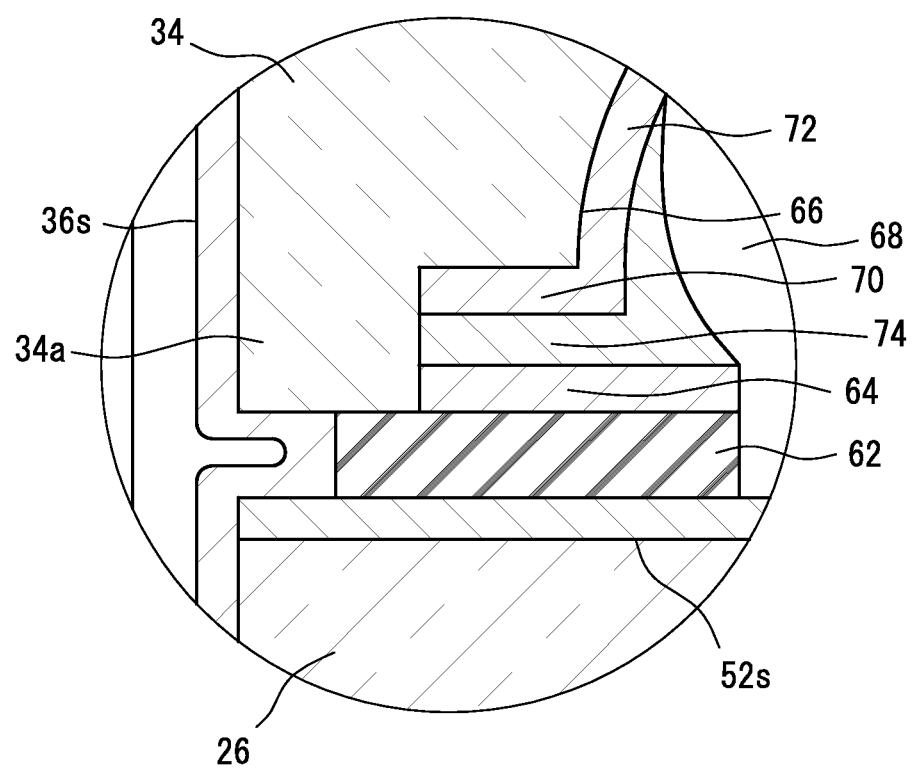
FIG. 8 is an enlarged cross-sectional view schematically showing the junction area between the substrate and the cover member, used to explain a connection structure between a signal/power supply line of a conductor pattern and a signal/power supply electrode, in the photoelectric conversion module in FIG. 3.

FIG. 8 is an enlarged cross-sectional view schematically showing the junction area between the substrate 26 and the cover member 34, used to explain a connection structure between the signal/power supply electrode 36s and the signal/power supply line 52s. As shown in FIG. 8, the signal/power supply electrode 36s is connected to an end portion of the signal/power supply line 52s extending from the insulating layer 62. On the other hand, the projection 34a and the insulating layer 62 are present between the signal/power supply electrode 36s, and the cover-side base film 70, the solder film 74 and the substrate-side base film 64 to prevent the direct contact therebetween.

Hereinafter, a preferable method of manufacturing the above-described photoelectric conversion module 24 will be described.

Figure 9:
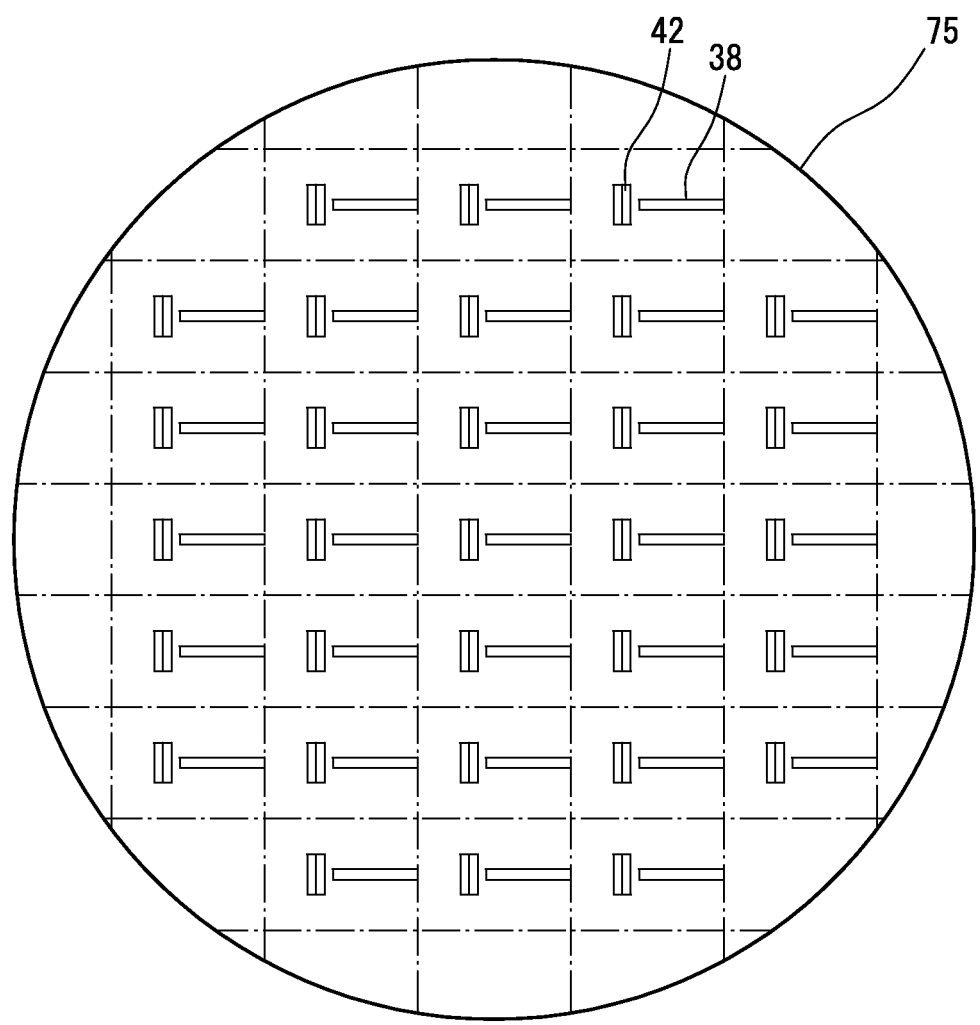
FIG. 9 is a schematic plane view used to explain a forming step of a holding groove and a mirror in a method of manufacturing the photoelectric conversion module in FIG. 3.

First, as shown in FIG. 9, a first wafer 75 is prepared as a material of the substrate 26. The first wafer 75 is finally cut along the dashed lines to be divided into the plural substrates 26.

On one surface of the prepared first wafer 75, the V-grooves and the holding grooves 38 are formed in correspondence to the respective substrates 26 obtained after the division, and the metal films are vapor-deposited on the V-grooves to form the mirrors 42.

Another alternative may be to apply a resin material on one surface of the first wafer 75 to form a resin film and in this resin layer, form the holding grooves 38 by exposure and development processes and form the V-groove by dicing or the like.

Figure 10:
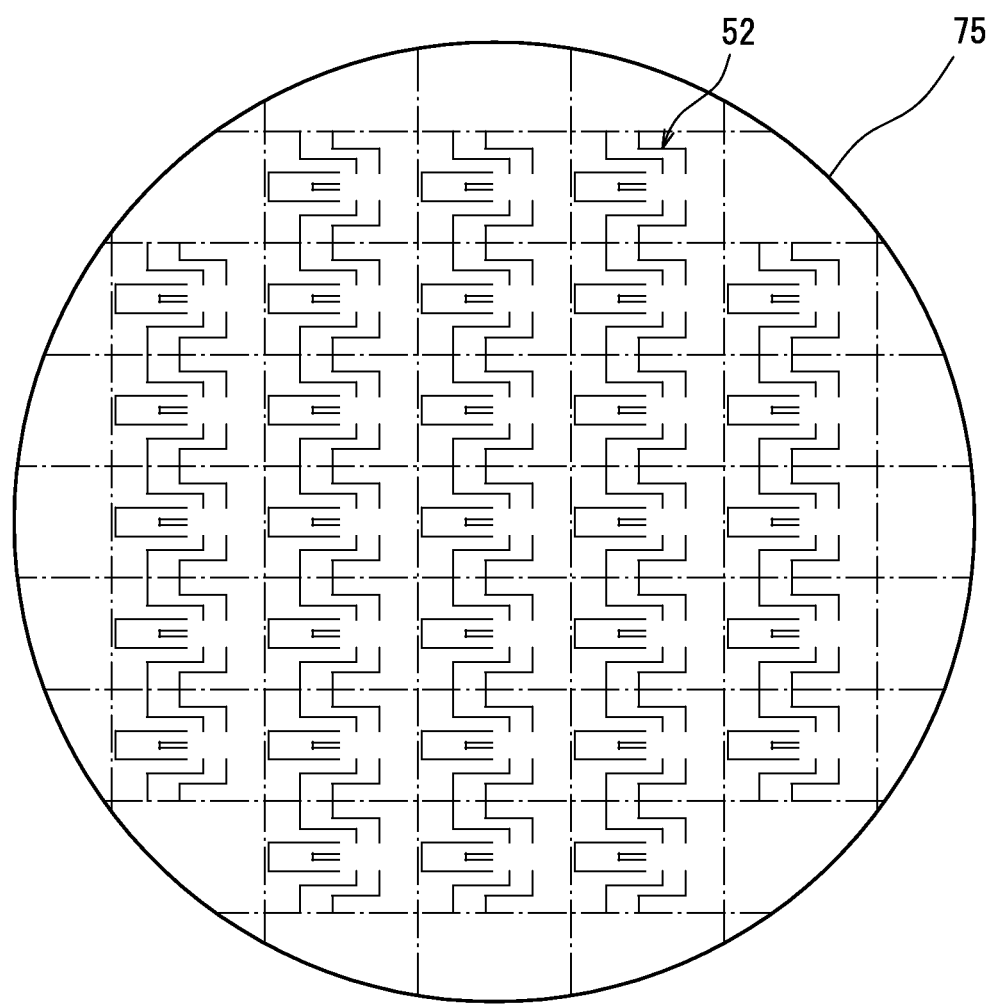
FIG. 10 is a schematic plane view used to explain a forming step of the conductor pattern in the method of manufacturing the photoelectric conversion module in FIG. 3.

Then, as shown in FIG. 10, on the other surface of the first wafer 75, the conductor patterns 52 are formed. The conductor patterns 52 are formed by, for example, plating the whole area of the other surface of the first wafer 75 with a metal film and thereafter etching the metal film.

Figure 11:
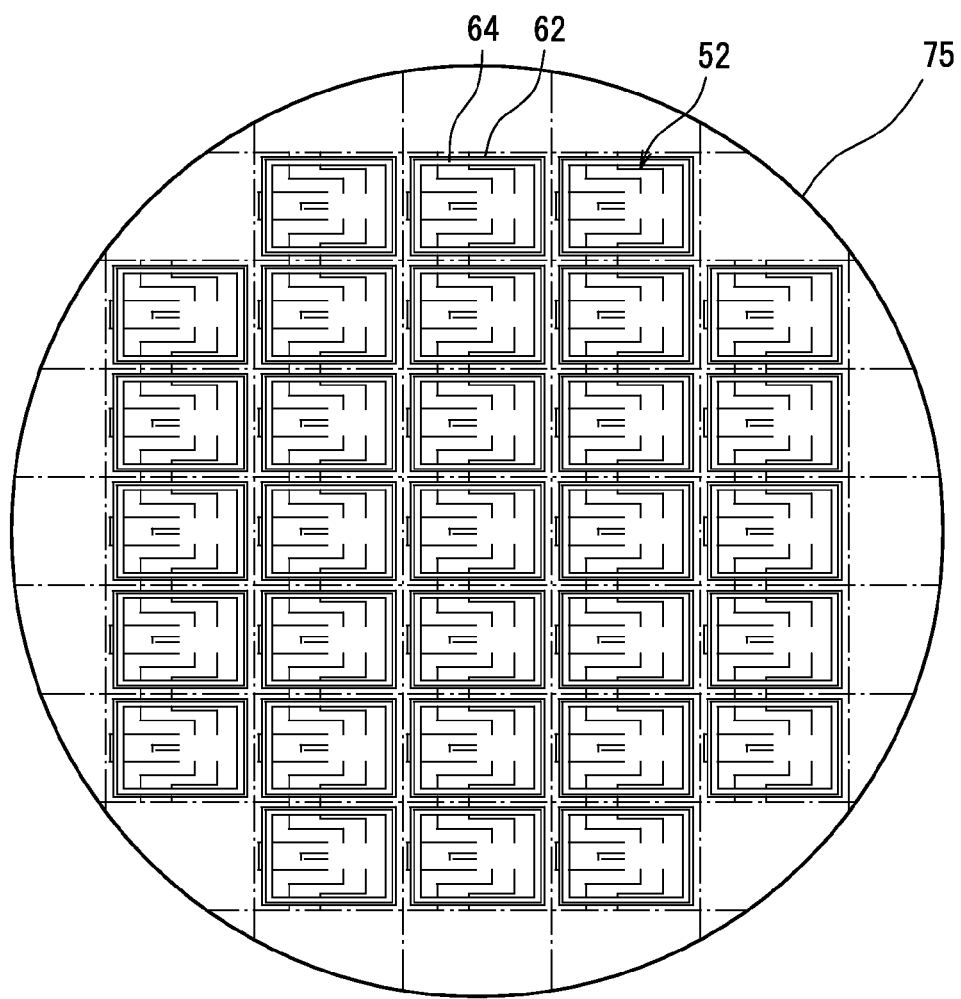
FIG. 11 is a schematic plane view used to explain a film forming step of an insulating layer and a substrate-side base film in the method of manufacturing the photoelectric conversion module in FIG. 3.

Next, as shown in FIG. 11, on the other surface of the first wafer 75, the insulating layers 62 are formed and further the substrate-side base films 64 are formed on the insulating layers 62. The insulating layers 62 can be formed by, for example, covering areas except areas where to form them by a mask, followed by physical vapor deposition or chemical vapor deposition.

Further, the substrate-side base films 62 can be formed by covering areas except areas where to form them by a mask, followed by electroless plating or electrolytic plating or followed by physical vapor deposition or chemical vapor deposition.

Figure 12:
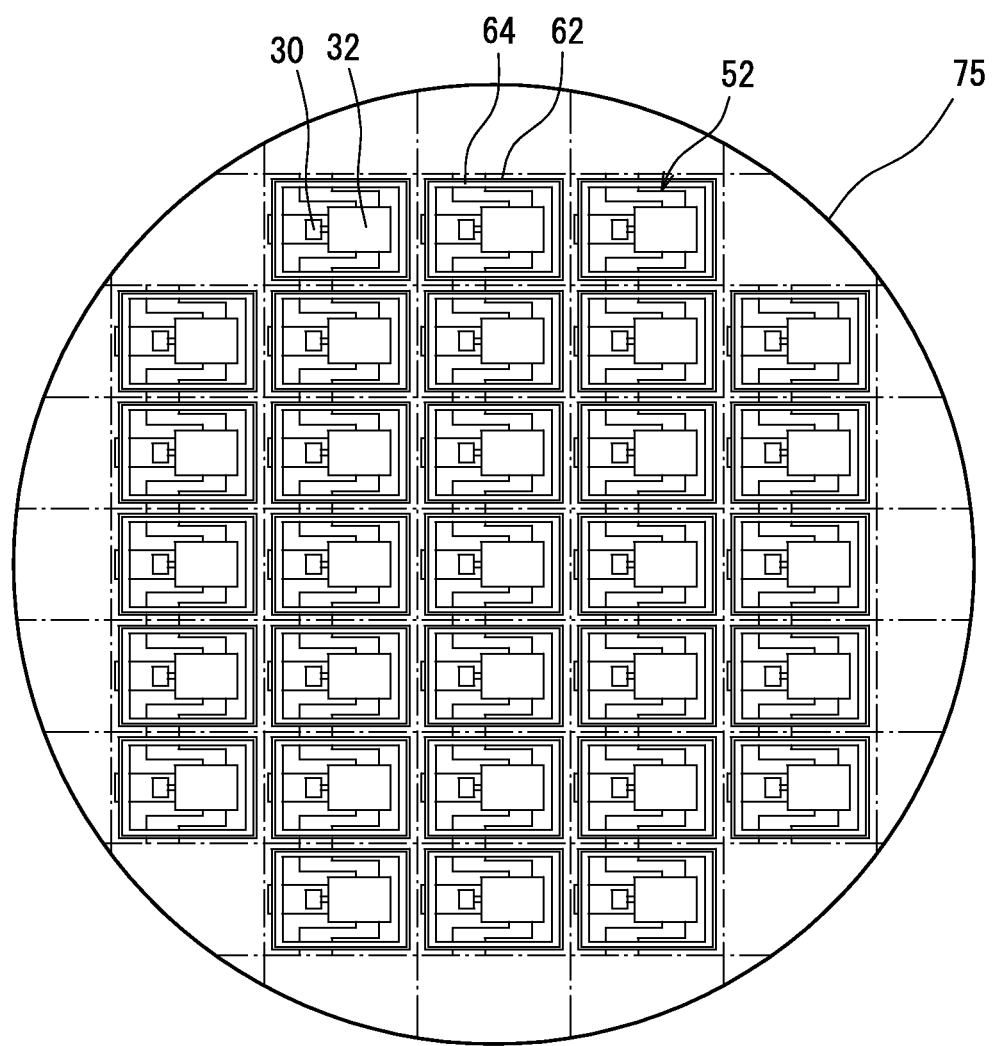
FIG. 12 is a schematic plane view used to explain a mounting step of the photoelectric conversion element and the IC chip in the method of manufacturing the photoelectric conversion module in FIG. 3.

Thereafter, as shown in FIG. 12, on the other surface of the first wafer 75, the photoelectric conversion elements 30 and the IC chips 32 are mounted by, for example, flip-chip mounting (mounting step).

Figure 13:
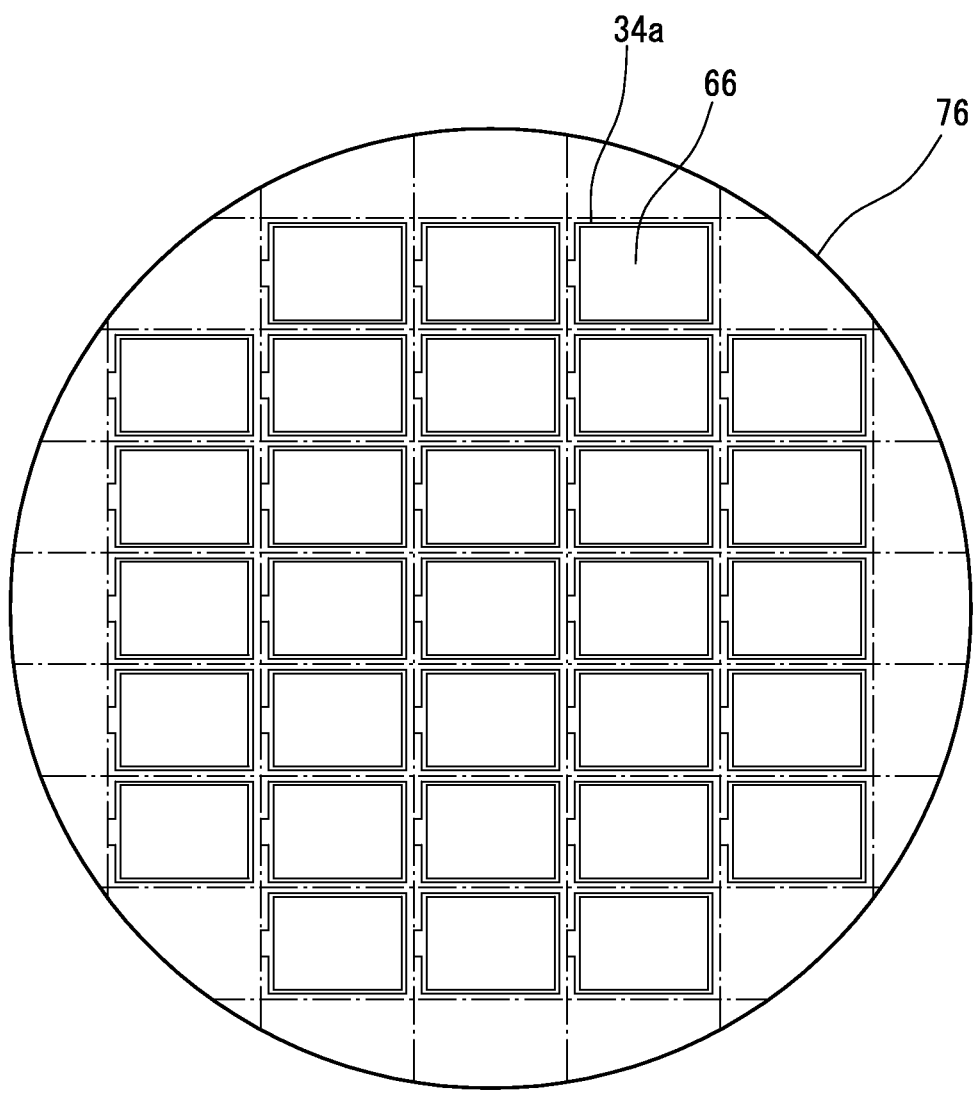
FIG. 13 is a schematic plane view used to explain a forming step of a depression of the cover member in the method of manufacturing the photoelectric conversion module in FIG. 3.

Meanwhile, as shown in FIG. 13, as a material of the cover member 34, a second wafer 76 is prepared. Then, on one surface of the second wafer 76, the projections 34a and the depressions 66 are formed by, for example, sandblasting.

Figure 14:
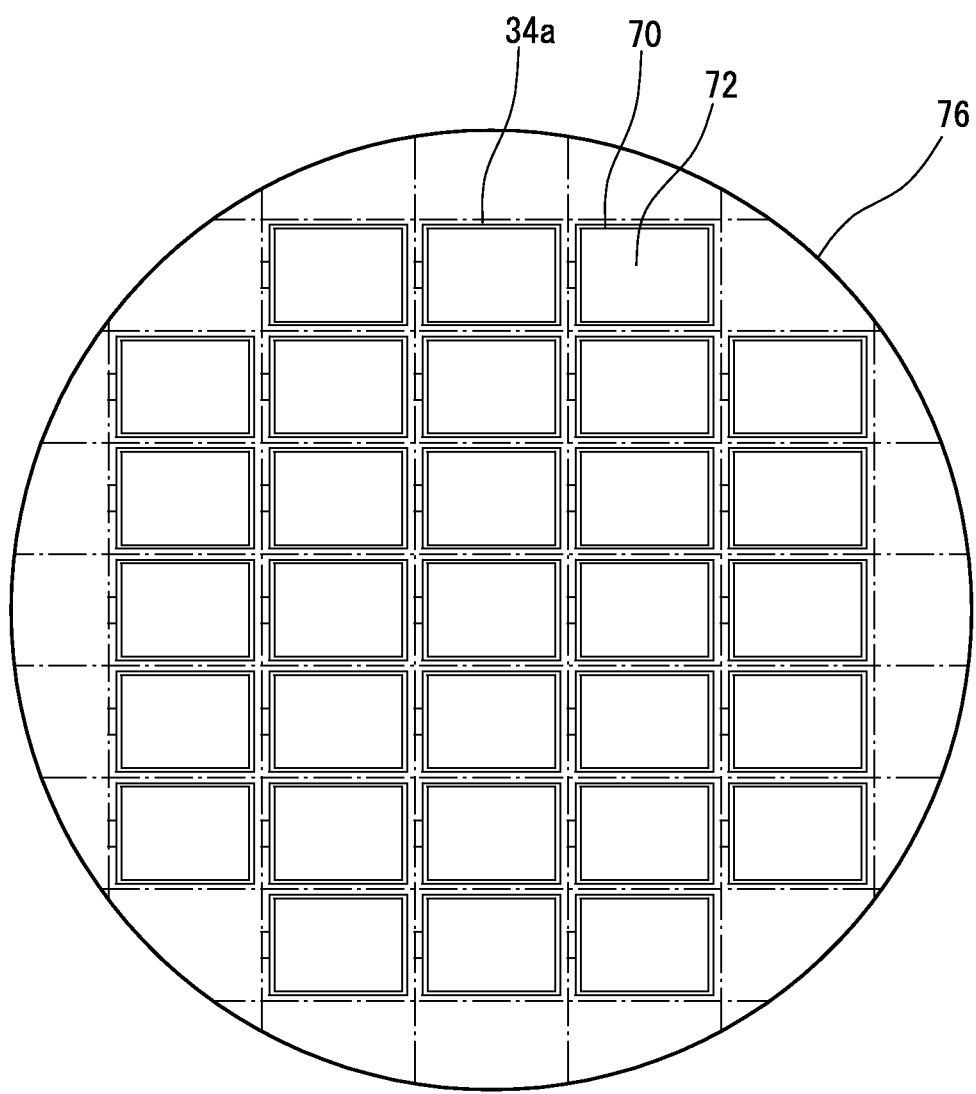
FIG. 14 is a schematic plane view used to explain a film forming step of a cover-side base film and a solder adsorbing film in the method of manufacturing the photoelectric conversion module in FIG. 3.

Next, as shown in FIG. 14, on the one surface of the second wafer 76, the cover-side base films 70 and the solder adsorbing films 72 are formed (film forming step). The cover-side base films 70 and the solder adsorbing films 72 can be formed by, for example, covering areas except areas where to form them by a mask, followed by electroless plating or electrolytic plating, or followed by physical vapor deposition or chemical vapor deposition.

Then, the solder to become the solder layers 74 is applied on the cover-side base films 70. At this time, the applied solder may be in a linear shape or may be in a ball shape.

Thereafter, under an inert gas atmosphere, the second wafer 76 on which the solder is applied is stacked on the first wafer 75 on which the photoelectric conversion elements 30 and the IC chips 32 are mounted, then they are heated, whereby the first wafer 75 and the second wafer 76 are joined by the solder (joining step). At the time of this joining, the solder forms the solder layers 74.

Figure 15:
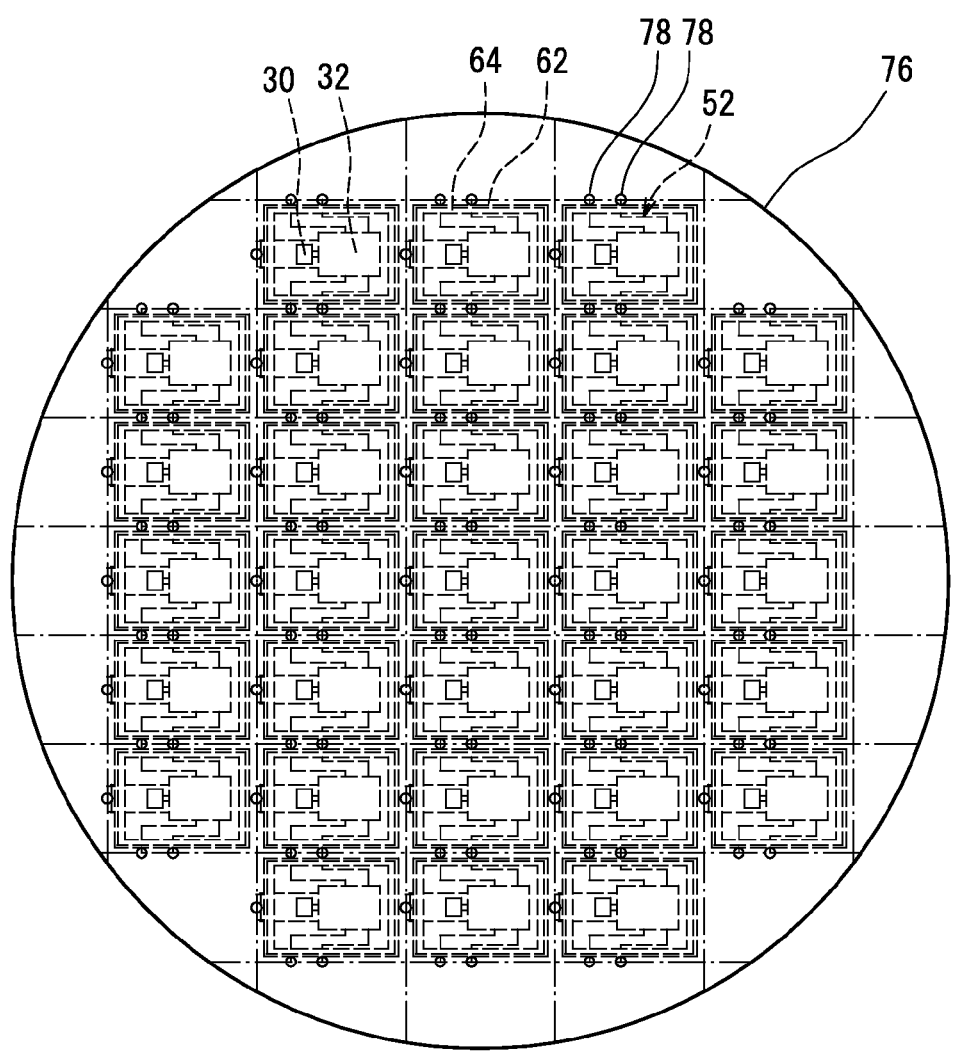
FIG. 15 is a schematic plane view used to explain a boring step of through holes in the method of manufacturing the photoelectric conversion module in FIG. 3.

Next, as shown in FIG. 15, through holes 78 penetrating through the first wafer 75 and the second wafer 76 are formed by, for example, drilling, sandblasting, etching, or the like, preferably by drilling (boring step). Then, on wall surfaces of the through holes 78, electroless plating or electrolytic plating is applied to form the plating films (plating step). Preferably, to form the plating films, Cu, Ni, and Au are applied in this order and gold plating is a surface layer of the plating film.

Thereafter, by using a dicing apparatus, the first wafer 75 and the second wafer 76 joined with each other are cut along cutting lines shown by the dashed lines (dividing step). At the time of this cutting, the plating films are divided into the conductive members 36. When the dividing step is thus finished, semi-finished products of the plural photoelectric conversion modules 24 are obtained.

Finally, after the tip portions of the optical fibers 23 are disposed in the holding grooves 38 of the obtained semi-finished products, the reinforcing members 40 are bonded on the substrates 26 of the semi-finished products with an adhesive, whereby the photoelectric conversion modules 24 are completed.

In the photoelectric conversion module 24 of the above-described first embodiment, when the solder melts by being heated to form the solder layer 74, an excessive portion of the solder squeezed out from between the substrate-side base film 64 and the cover-side base film 70 spreads on the solder adsorbing film 72 and does not spread on the mounting surface of the substrate 26. Consequently, in this photoelectric conversion module 24, short circuit caused by the excessive solder does not occur even when it is downsized.

In the photoelectric conversion module 24 of the above-described first embodiment, since the insulating layer 62 is provided between the solder layer 74 and the mounting surface of the substrate 26, the shape of the conductor pattern 52 is not limited. That is, a degree of freedom of the wiring on the mounting surface is high, which makes it possible to form the wiring also on the end of the mounting surface.

In the photoelectric conversion module 24 of the above-described first embodiment, since the area near the opening of the wall surface of the depression 66 is inclined relative to the mounting surface, the solder squeezed out easily spreads on the solder adsorbing film 72. This surely prevents the excessive solder from spreading on the mounting surface of the substrate 26.

In the photoelectric conversion module 24 of the above-described first embodiment, the solder adsorbing film 72 covers the whole area of the depression 66, and by grounding the solder adsorbing film 72 through the single conductive member 36, an excellent shielding property is obtained.

In the photoelectric conversion module 24 of the above-described first embodiment, as a preferable form, the substrate 26 and the cover member 34 are equal in coefficient of linear expansion because they are made of the same material, which prevents the exfoliation of the cover member 34 from the substrate 26.

In the photoelectric conversion module 24 of the above-described first embodiment, since the substrate-side base film 64 extends to a more inner side than the cover-side base film 70 as a preferable form, a width of the solder layer 74, that is, a sealing width becomes wide, which ensures good airtightness.

Further, according to the method of manufacturing the photoelectric conversion module 24 of the above-described first embodiment, the main steps such as the film forming step, the boring step, and the plating step are performed to the first wafer 75 and the second wafer 76, which enables mass production of the photoelectric conversion module 24. Therefore, the photoelectric conversion module 24 is provided at low cost.

Second Embodiment

Figure 16:
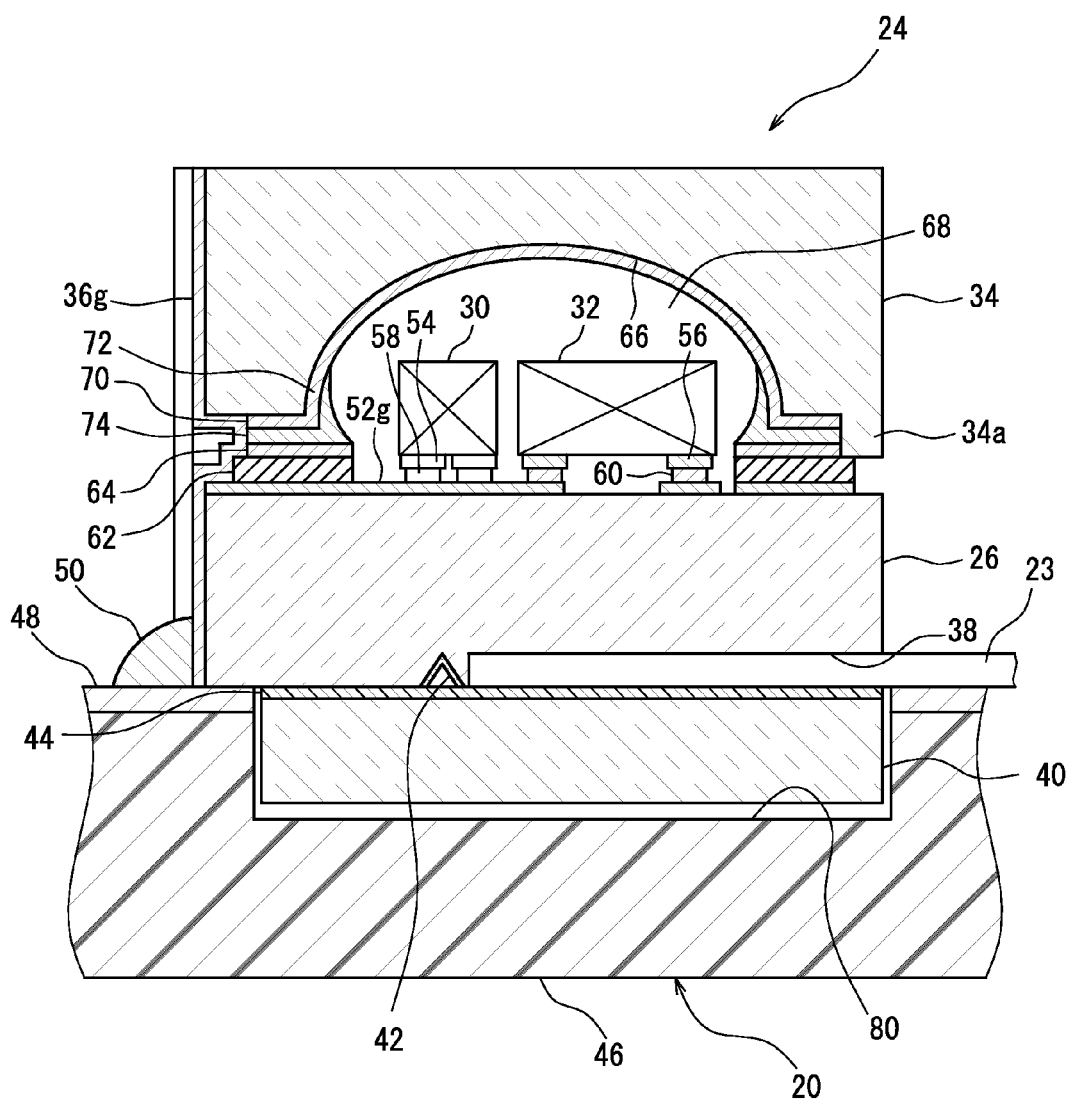
FIG. 16 is a schematic cross-sectional view used to explain another mounting method of the photoelectric conversion module in FIG. 3 on the second motherboard, as a second embodiment.

Hereinafter, a second embodiment will be described with reference to FIG. 16.

The second embodiment is different from the first embodiment only in that the substrate 26 side of the photoelectric conversion module 24 is fixed to the second motherboard 20. In this case, in the second motherboard 20, a hole, a cutout, a U-groove, or the like is provided as a depression 80 receiving the reinforcing member 40.

In the second embodiment, the same effects as those of the first embodiment can be obtained.

Third Embodiment

Figure 17:
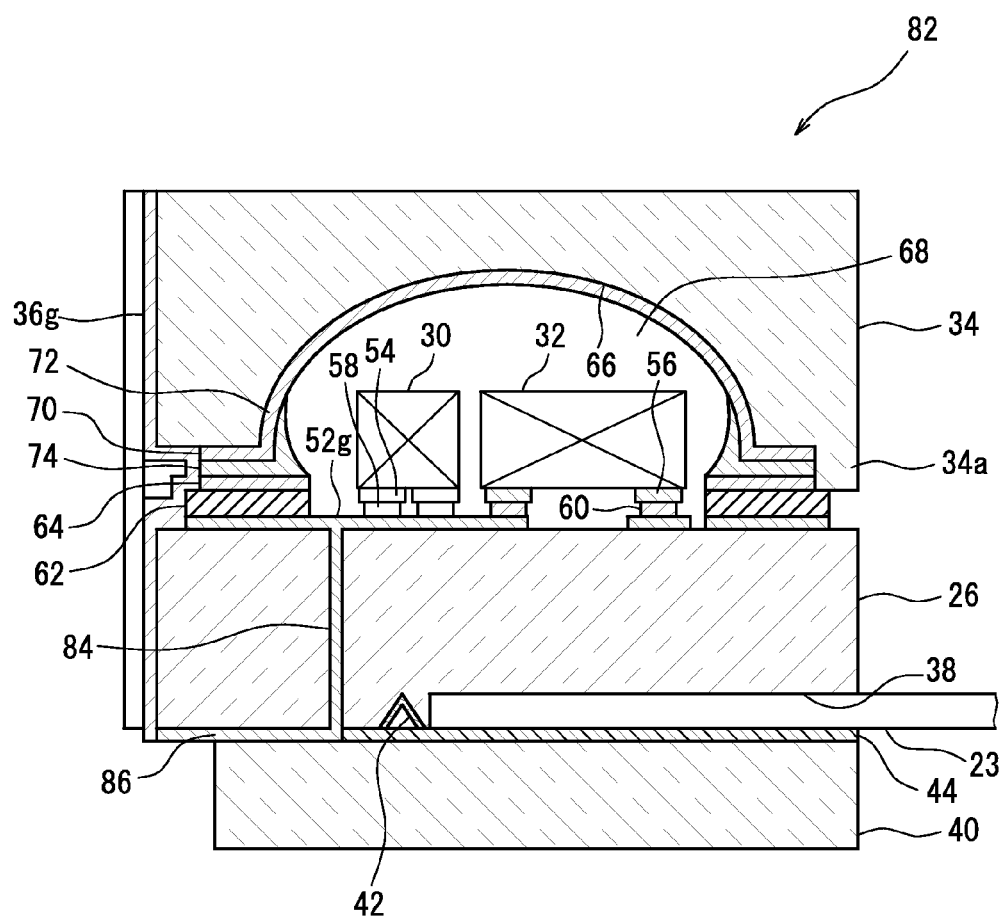
FIG. 17 is a schematic cross-sectional view of a photoelectric conversion module of a third embodiment.

Hereinafter, a photoelectric conversion module 82 of a third embodiment will be described with reference to FIG. 17.

In the photoelectric conversion module 24 of the above-described first embodiment, the conductor pattern 52 is connected to the conductive members 36 at the end of the mounting surface, but the conductor pattern 52 may be connected to the conductive members 36 in another route as in the photoelectric conversion module 82. Concretely, as the other route, through holes may be provided in the substrate 26, through hole conductors 84 filled in the through holes and another conductor pattern 86 provided on the rear surface of the substrate 26 may be provided. The through holes, the through hole conductors 84, and the conductor pattern 86 are formed prior to the mounting step.

In the third embodiment, the same effects as those of the first embodiment can be obtained.

Fourth Embodiment

Figure 18:
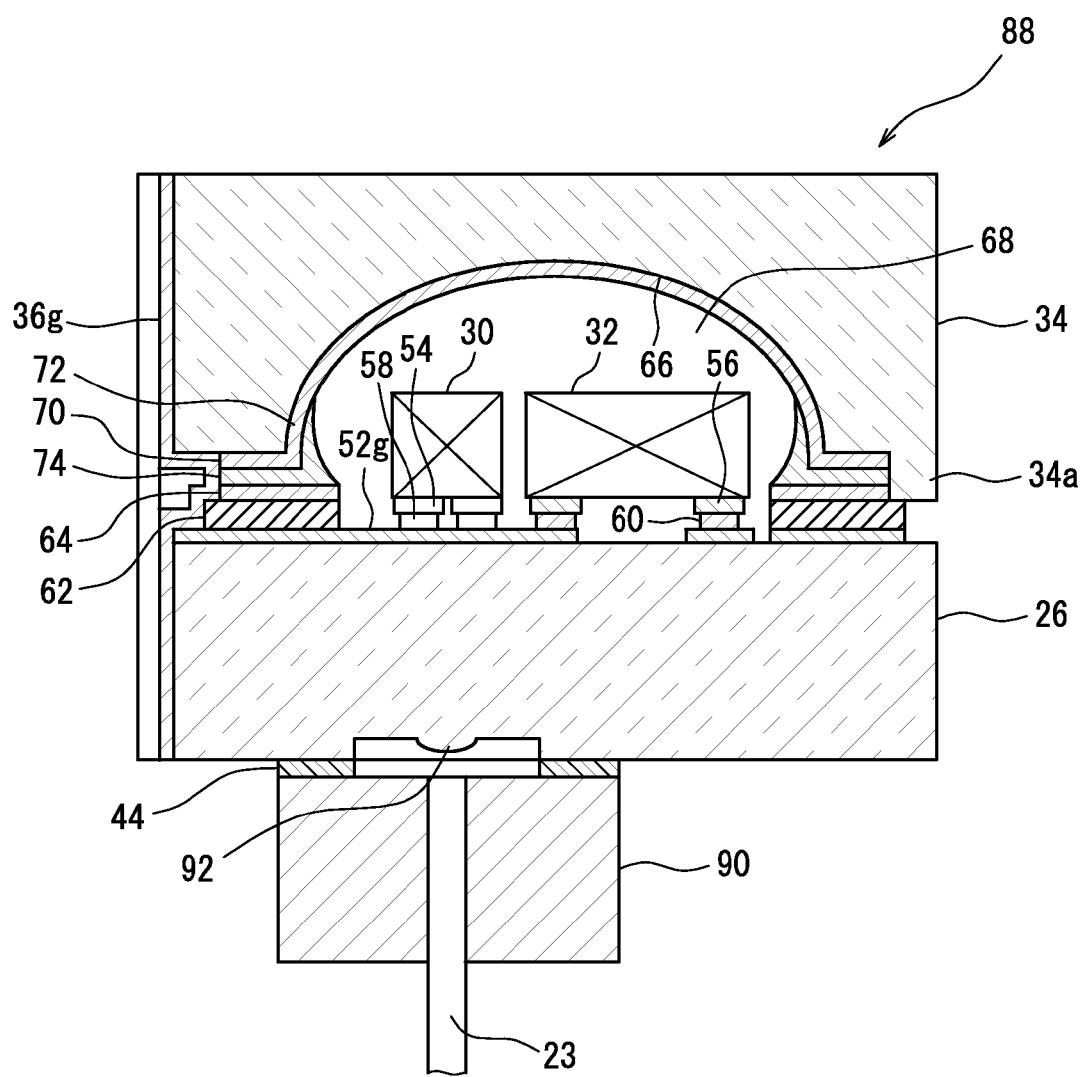
FIG. 18 is a schematic cross-sectional view of a photoelectric conversion module of a fourth embodiment.

Hereinafter, a photoelectric conversion module 88 of a fourth embodiment will be described with reference to FIG. 18.

In the photoelectric conversion module 24 of the above-described first embodiment, as a preferable form, the tip portion of the optical fiber 23 is fixed in the holding groove 38 in the rear surface of the substrate 26, but it may be fixed by another fixing means.

For example, as in the photoelectric conversion module 88, the tip portion of the optical fiber 23 may be fixed perpendicularly to the rear surface of the substrate 26 so that an optical axis of the photoelectric conversion element 30 and an optical axis of the optical fiber 23 coincide with each other.

In this case, a ferule 90 fixing the tip portion of the optical fiber 23 is fixed to the rear surface of the substrate 26 by an adhesive layer 44. Then, when necessary, a lens 92 is provided between the photoelectric conversion element 30 and the optical fiber 23. Preferably, the lens 92 is formed integrally on the rear surface of the substrate 26. A forming step of the lens 92 can be performed in place of, for example, the forming step of the mirror 42.

In the fourth embodiment, the same effects as those of the first embodiment can be obtained.

Fifth Embodiment

Figure 19:
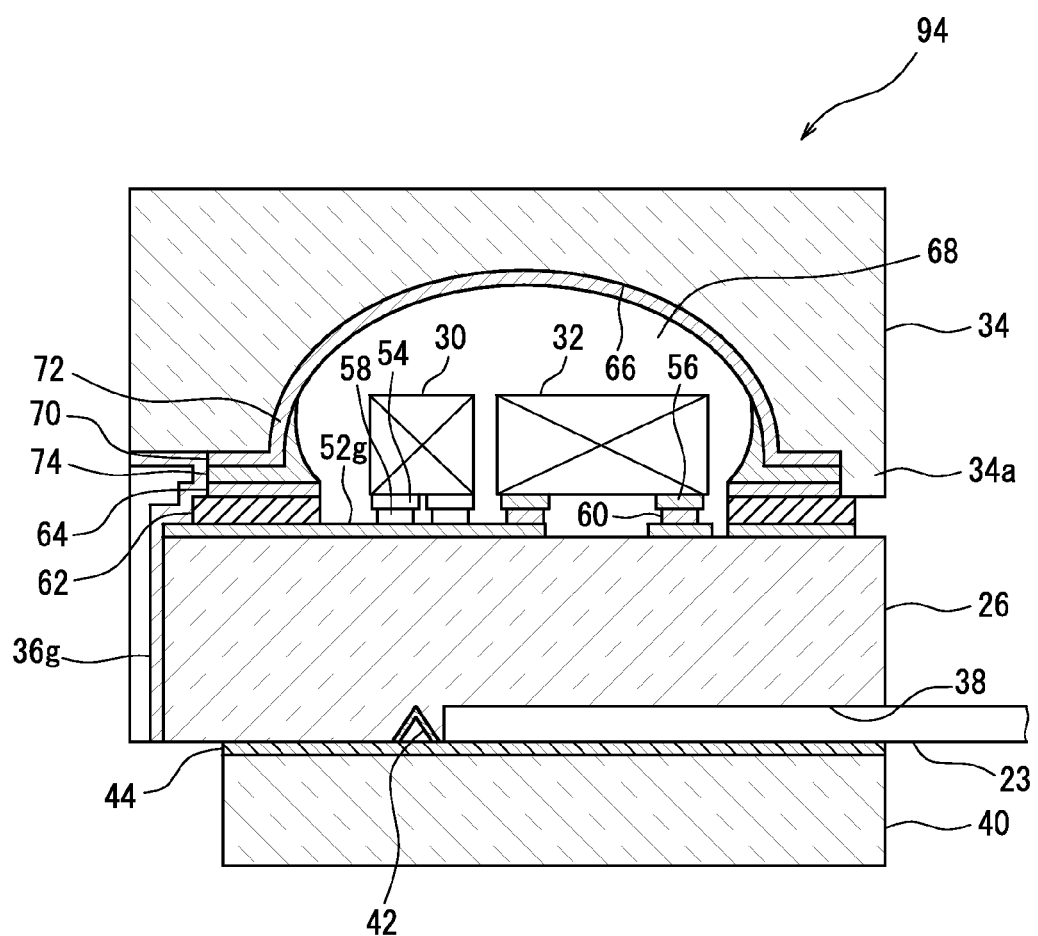
FIG. 19 is a schematic cross-sectional view of a photoelectric conversion module of a fifth embodiment.

Hereinafter, a photoelectric conversion module 94 of a fifth embodiment will be described with reference to FIG. 19.

In the photoelectric conversion module 24 of the above-described first embodiment, as a preferable form, the concave portions are also formed in the side surfaces of the cover member 34, and the conductive members 36 cover the concave portions of the cover member 34, but as in the photoelectric conversion module 94, the conductive members 36 may be provided only on the surfaces of the concave portions in the side surfaces of the substrate 26, without the concave portions on the cover member 34 side being provided.

In this case, the boring step and the plating step come before the joining step of the first wafer 75 and the second wafer 76.

In the fifth embodiment, the same effects as those of the first embodiment can be obtained.

Sixth Embodiment

Figure 20:
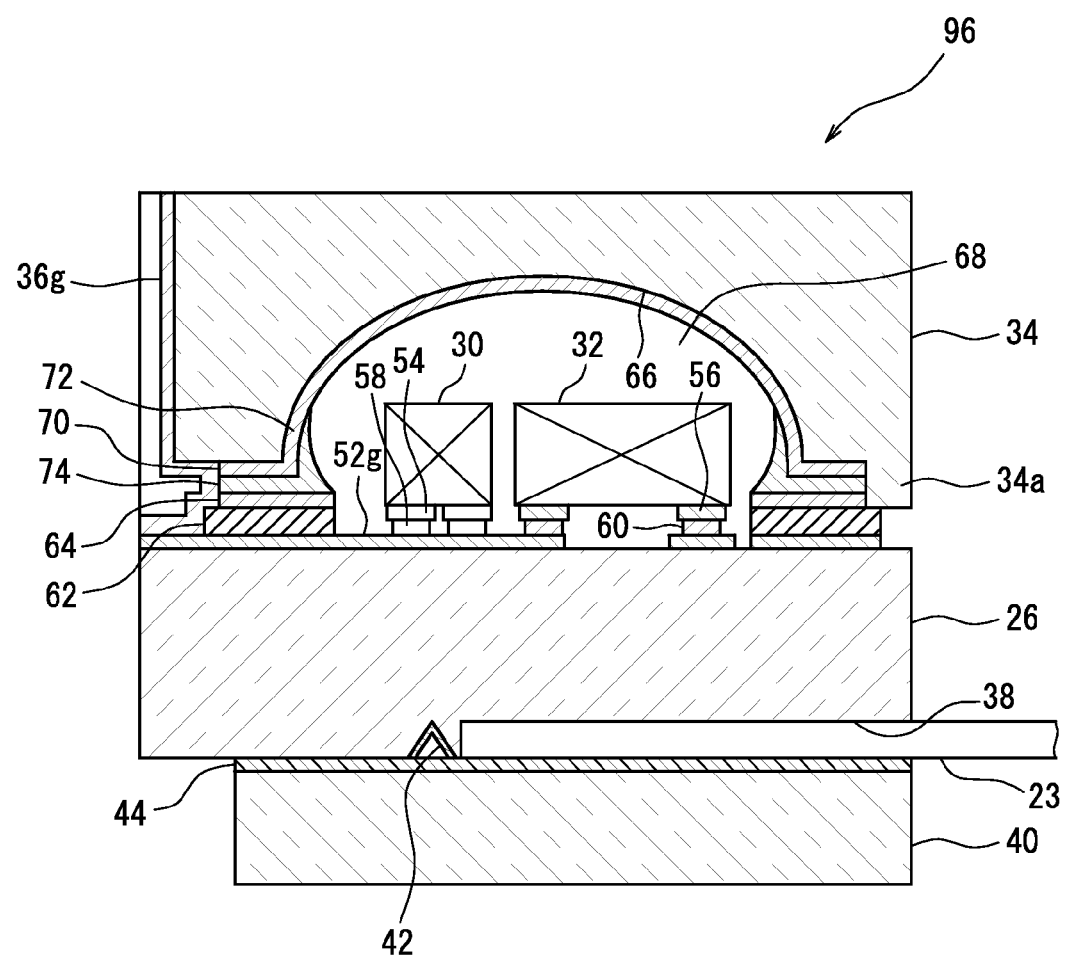
FIG. 20 is a schematic cross-sectional view of a photoelectric is conversion module of a sixth embodiment.

Hereinafter, a photoelectric conversion module 96 of a sixth embodiment will be described with reference FIG. 20.

In the photoelectric conversion module 24 of the above-described first embodiment, as a preferable form, the concave portions are formed in the side surfaces of the substrate 26 and the side surfaces of the cover member 34, and the conductive members 36 cover the concave portions of the substrate 26 and the concave portions of the cover member 34, but as in the photoelectric conversion module 96, the conductive members 36 may be provided only on the surfaces of the concave portions in the side surfaces of the cover member 34, without the concave portions on the substrate 26 side being provided.

In this case, the boring step and the plating step come before the joining step of the first wafer 75 and the second wafer 76.

In the sixth embodiment, the same effects as those of the first embodiment can be obtained.

As described hitherto, according to the present invention, there is provided a highly reliable photoelectric conversion module in which short circuit caused by the spread of the sealing solder is prevented even when it is downsized, and a method of manufacturing the photoelectric conversion module.

The present invention is not limited to the above-described first to sixth embodiments, and includes embodiments where two or more of the first to sixth embodiments are appropriately combined and embodiments where changes are made in these embodiments.

Finally, the optical wiring including the photoelectric conversion module of the present invention is applicable to information processing devices other than mobile phones, network devices, digital AV devices, and home electric appliances. More specifically, the photoelectric conversion module is also applicable to, for example, a personal computer, a switching hub, a HDMI (trademark: High Definition Multimedia Interface) cable, and so on.

EXPLANATION OF NUMERALS AND SYMBOLS

20 second motherboard
22 optical wiring
23 optical fiber
24 photoelectric conversion module
26 substrate
30 photoelectric conversion element
32 IC chip
34 cover member
36 conductive member
38 holding groove
40 reinforcing member
52 conductor pattern
62 insulating layer
68 housing chamber (airtight chamber)
72 solder adsorbing film
74 solder layer

What is claimed is:

1. A photoelectric conversion module comprising:
   a substrate having a light transmitting property and having a mounting surface;
   a photoelectric conversion element mounted on the mounting surface of said substrate;
   a cover member fixed to said substrate via a solder layer constituted by solder and forming, cooperatively with said substrate, an airtight chamber housing said photoelectric conversion element; and
   a solder adsorbing film provided near an area fixed to said substrate by the solder layer, in a surface, of said cover member, facing the mounting surface, the solder layer having an adhesive property to said solder adsorbing film.

2. The photoelectric conversion module according to claim 1, wherein:
   said cover member has a depression forming the airtight chamber in the surface facing the mounting surface;
   an area near an opening of a wall surface of the depression is inclined relative to the mounting surface; and
   said solder adsorbing film is provided at least on the area near the opening of the wall surface of the depression.

3. The photoelectric conversion module according to claim 2, further comprising:
   a conductor pattern formed on the mounting surface and having conductivity; and
   an insulating layer provided between said conductor pattern and the solder layer and having an insulating property.

4. The photoelectric conversion module according to claim 3, wherein said solder adsorbing film covers a whole area of the wall surface of the depression.

5. The photoelectric conversion module according to claim 4, wherein said solder adsorbing film has conductivity and is grounded.

6. The photoelectric conversion module according to claim 5, wherein said substrate and said cover member are made of a same material.

7. The photoelectric conversion module according to claim 6, wherein said substrate and said cover member are each made of one kind selected from a group consisting of silicon, glass, and sapphire.

8. The photoelectric conversion module according to claim 2, wherein said solder adsorbing film covers a whole area of the wall surface of the depression.

9. The photoelectric conversion module according to claim 8, wherein said solder adsorbing film has conductivity and is grounded.

10. The photoelectric conversion module according to claim 9, wherein said substrate and said cover member are made of a same material.

11. The photoelectric conversion module according to claim 10, wherein said substrate and said cover member are each made of one kind selected from a group consisting of silicon, glass, and sapphire.

12. The photoelectric conversion module according to claim 2, wherein said substrate and said cover member are made of a same material.

13. The photoelectric conversion module according to claim 12, wherein said substrate and said cover member are each made of one kind selected from a group consisting of silicon, glass, and sapphire.

14. The photoelectric conversion module according to claim 1, further comprising:
   a conductor pattern formed on the mounting surface and having conductivity; and
   an insulating layer provided between said conductor pattern and the solder layer and having an insulating property.

15. The photoelectric conversion module according to claim 14, wherein said substrate and said cover member are made of a same material.

16. The photoelectric conversion module according to claim 15, wherein said substrate and said cover member are each made of one kind selected from a group consisting of silicon, glass, and sapphire.

17. The photoelectric conversion module according to claim 1, wherein said substrate and said cover member are made of a same material.

18. The photoelectric conversion module according to claim 17, wherein said substrate and said cover member are each made of one kind selected from a group consisting of silicon, glass, and sapphire.

19. The photoelectric conversion module according to claim 1, wherein said substrate and said cover member are each made of one kind selected from a group consisting of silicon, glass, and sapphire.

* * * * *

UNITED STATES PATENT AND TRADEMARK OFFICE
CERTIFICATE OF CORRECTION

PATENT NO. : 8,698,264 B2
APPLICATION NO. : 13/355668
DATED : April 15, 2014
INVENTOR(S) : Kouki Hirano et al.

It is certified that error appears in the above-identified patent and that said Letters Patent is hereby corrected as shown below:

On the Title Page, Item (73) Assignee:

change "Hitachi Cable, Ltd." to --Hitachi Metals, Ltd.--

Signed and Sealed this
Twelfth Day of August, 2014

Michelle K. Lee
*Deputy Director of the United States Patent and Trademark Office*